United States Patent [19]
Cox

[11] 3,777,275
[45] Dec. 4, 1973

[54] LINEAR AMPLIFICATION WITH NONLINEAR DEVICES

[75] Inventor: Donald Clyde Cox, New Shrewsbury, N.J.

[73] Assignee: Bell Telephone Laboratories, Incorporated, Murray Hill, N.J.

[22] Filed: Jan. 31, 1972

[21] Appl. No.: 222,243

[52] U.S. Cl. .................................... 330/10, 330/117
[51] Int. Cl. ............................................... H03f 3/38
[58] Field of Search ......................... 330/14, 10, 117

[56] References Cited

UNITED STATES PATENTS

| | | | |
|---|---|---|---|
| 3,500,219 | 3/1970 | Rhodes | 330/14 |
| 3,426,245 | 2/1969 | Yurasek et al. | 315/27 |
| 3,553,491 | 1/1971 | Schulz | 307/235 |

*Primary Examiner*—Nathan Kaufman
*Attorney*—W. L. Keefauver et al.

[57] ABSTRACT

Available nonlinear amplifying devices are used to produce bandpass linear amplification of a signal having amplitude variations. The input signal is transformed into two constant amplitude phase modulated components which together contain in their phase fluctuations the total information content of the input. The components are amplified separately by devices which preserve phase, and the recombination of the amplified components reproduces a linearly amplified replica of the original input. The technique is primarily useful at high frequencies and can be modified to provide frequency translation.

5 Claims, 5 Drawing Figures

LINEAR AMPLIFICATION WITH NONLINEAR DEVICES

BACKGROUND OF THE INVENTION

This invention relates to amplification circuits, and more particularly to circuits for providing linear bandpass amplification of high frequency, amplitude varying signals.

In many communication applications a linear overall response of the transmitter power amplifier is required because the signal to be amplified contains amplitude variations and a nonlinear device would cause undesirable distortion. Hence, systems utilizing standard AM transmission and those using more complex amplitude varying signals, such as ones having single sideband modulation or frequency multiplexed sets of separately modulated low-level carriers, both of which contain a composite of amplitude and phase fluctuations, are severely limited by the availability of linear amplifying devices.

Unfortunately, solid-state linear power amplifiers are difficult to build for high microwave and millimeter wave frequencies, and at lower frequencies high power linear devices are often unavailable or very expensive. substantially Conversely, nonlinear solid-state power amplifiers are readily available at low microwave frequencies, and constant amplitude phase lockable signal sources (GUNN and IMPATT diodes) are available in the high microwave and millimeter wave region. For high power applications in the microwave and lower frequency regions, nonlinear electron tube amplifiers and power oscillators are substnatially less costly than are linear devices.

It is an object of the present invention to provide linear amplification of amplitude varying signals at microwave and millimeter wave frequencies, especially above a few GHz, by using only available state of the art nonlinear amplifying devices. It is also an object of the present invention to utilize the same principles to provide linear amplification suitable for high power applications at lower frequencies.

SUMMARY OF THE INVENTION

In accordance with the present invention, LInear amplification with Nonlinear Devices (LIND) is provided by separating a bandpass input signal, which may have either or both amplitude and phase (frequency) variations, into two components, both of which are constant amplitude signals having variations in phase only. These two constant amplitude phase modulated signals are amplified separately by available state of the art amplifying devices having sufficient bandwidth but possibly nonlinear characteristics. The amplified component signals are then recombined linearly to reproduce an amplified replica of the input signal.

The LIND amplifier circuit including the component separator and linear recombiner, as well as the amplifying devices can be totally constructed with state of the art technology. The LIND circuit can also provide frequency translation of the separated components so that the recombined output is shifted in frequency.

DETAILED DESCRIPTION

Figure 1:
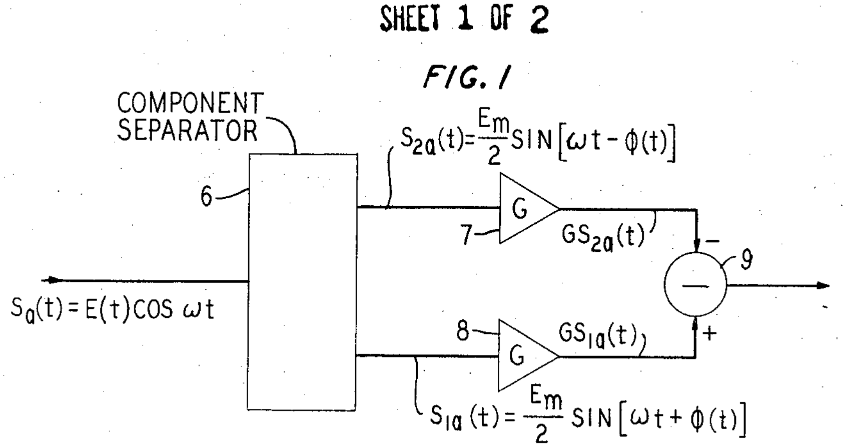
FIG. 1 is a generalized block diagram of a LIND amplifier circuit in accordance with the present invention.

The principles and operation of the invention may be best understood by reference to FIG. 1 which illustrates the LIND amplifier circuit in its most general form. The simplest input is a bandpass signal which has only amplitude fluctuations. As used herein a bandpass signal has a defined fixed upper and lower frequency cutoff. An input signal of this type may be designated $$S_a(t) = E(t) \cos \omega t \quad (1)$$

where $E(t)$ represents amplitude variation, $\omega$ is the carrier frequency, and $t$ represents time; ( ) is the function notation used in the conventional sense to indicate a variation of the quantity preceding the parenthesis as a function of the quantity within the parenthesis, for example, $E(t)$ indicates the variation of amplitude with time. The input signal $S_a(t)$ is applied to component separator 6 to produce two constant amplitude signals $S_{1a}(t)$ and $S_{2a}(t)$ which are related to $S_a(t)$ as follows:

$$S_a(t) = S_{1a}(t) - S_{2a}(t) \quad (2)$$

A variable $\phi(t)$ may be defined by $$E(t) = E_m \sin \phi(t) \quad (3)$$

where $E_m$ is a constant equal to the maximum value of $E(t)$. Then in terms of $\phi(t)$ and $E_m$ the constant amplitude signal components are:

$$S_{1a}(t) = (E_m/2) \sin [\omega t + \phi(t)] \quad (4)$$

and $$S_{2a}(t) = (E_m/2) \sin [\omega t - \phi(t)] \quad (5)$$

Figure 2:
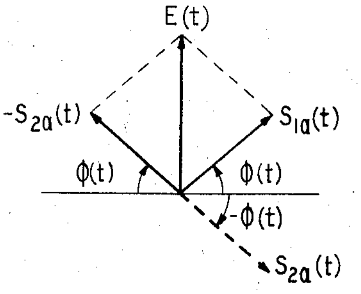
FIG. 2 is a graphical presentation helpful in explaining the operation of the invention.

$S_{1a}(t)$ and $S_{2a}(t)$, which may be represented by constant amplitude vectors rotating in opposite directions of $\phi(t)$, contain all of the information content of the amplitude variations $E(t)$ of the input $S_a(t)$. These vectors are illustrated in FIG. 2.

Since the components $S_{1a}(t)$ and $S_{2a}(t)$ are of constant amplitude, they can be amplified separately in nonlinear amplifying devices 7 and 8, each having an identical gain G over the passband of the bandpass signal. These devices may actually be power oscillators using GUNN diodes, IMPATT diodes, or even magnetrons which are phase or injection locked to $S_{1a}(t)$ and $S_{2a}(t)$. The amplified output is obtained by subtracting $GS_{2a}(t)$ from $GS_{1a}(t)$ in combiner 9:

$$\begin{aligned} GS_{1a}(t) - GS_{2a}(t) &= \\ (GE_m/2) \sin [\omega t + \phi(t)] - (GE_m/2) \sin [\omega t - \phi(t)] &= \\ GE_m \sin \phi(t) \cos \omega t &= \\ GE(t) \cos \omega t &= \\ GS_a(t) & \quad (6) \end{aligned}$$

Similarly, a general representation of a bandpass signal containing in addition to amplitude variations phase variations $\theta(t)$ may be represented as $$S(t) = E(t) \cos [\omega t + \theta(t)] \quad (7)$$

The two constant amplitude components are:

$$S_1(t) = (E_m/2) \sin [\omega t + \theta(t) + \phi(t)] \quad (8)$$

and $$S_2(t) = (E_m/2) \sin [\omega t + \theta(t) - \phi(t)] \quad (9)$$

and the circuit of FIG. 1 would produce a linearly amplified replica of the signal $S(t)$.

Figure 3:
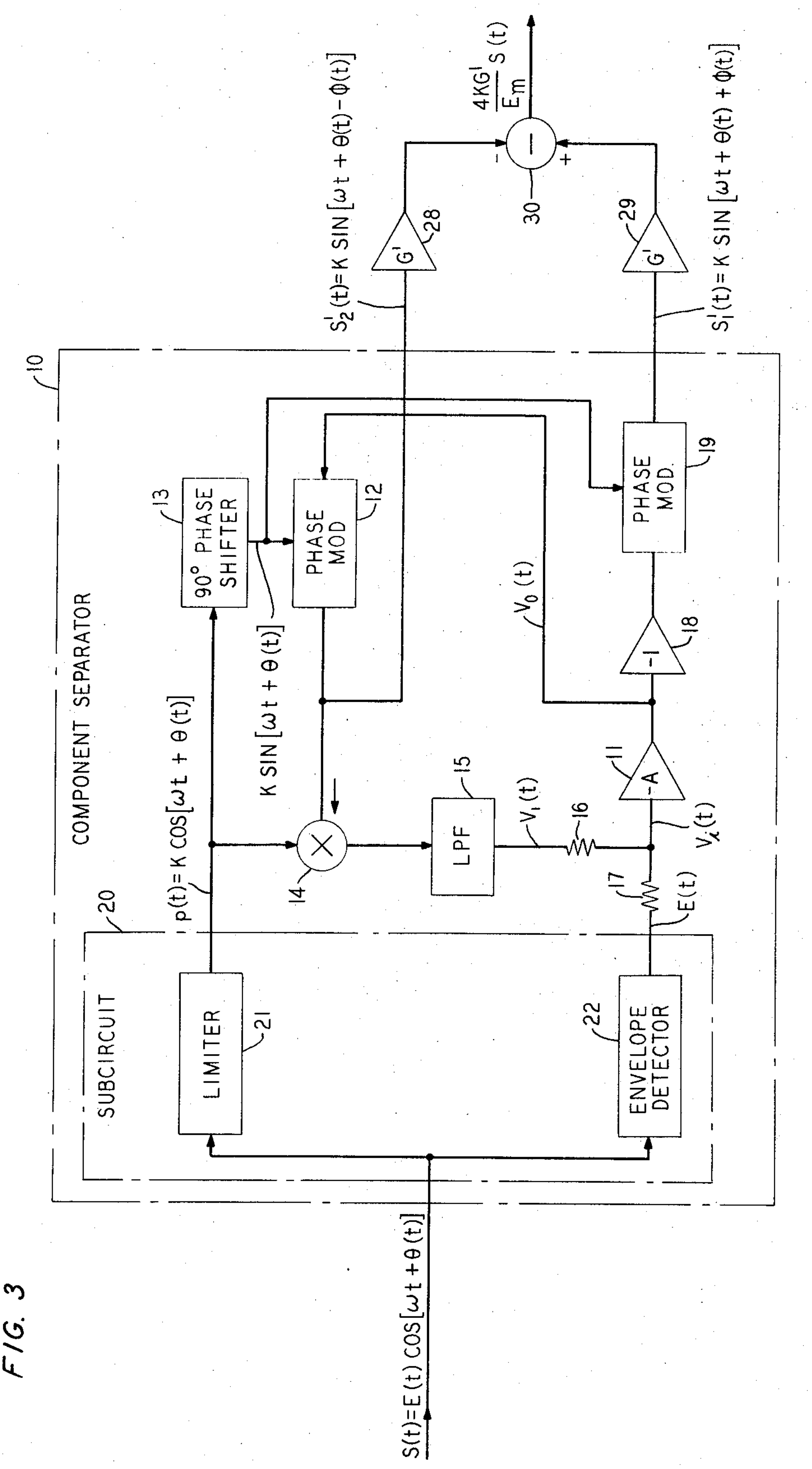
FIG. 3 is a block diagram of one embodiment of the invention.

FIG. 3 illustrates one specific embodiment of the LIND amplifier in accordance with the present invention. The input $S(t)$ is a general bandpass signal containing both amplitude and phase modulation, but of course, the phase modulation may or may not be present in a specific application. The circuit would also operate without amplitude variation although alternative amplifiers would be available in that case.

In the implementation illustrated, the two constant amplitude conponent signals generated from $S(t)$ by component separator 10 are designated $S'_1(t)$ and $S'_2(t)$ differing from $S_1(t)$ and $S_2(t)$ of Equations (8) and (9), respectively, only by a common constant. The first step is to obtain the envelope $E(t)$, and a constant amplitude phase modulated term $$p(t) = K \cos [\omega t + \theta(t)] \quad (10)$$

Figure 4:
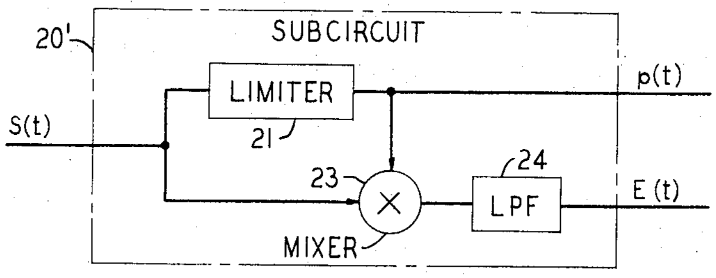
FIG. 4 is a diagram of an alternative subcircuit in the embodiment of FIG. 3.

These signals are produced by subcircuit 20 which generates $p(t)$ by passing $S(t)$ through limiter 21 having a limiting constant $K$. The envelope $E(t)$ can be obtained directly from linear envelope detector 22. Alternatively, subcircuit 20 may be replaced by subcircuit 20' shown in FIG. 4 in which limiter 21 again yields $p(t)$ while a synchronous detector formed by mixer 23 and lowpass filter 24 arranged as illustrated generates the envelope $E(t)$.

Both $E(t)$ and $p(t)$ are utilized to obtain the components $S'_1(t)$ and $S'_2(t)$. A feedback loop containing amplifier 11, phase modulator 12, mixer 14, filter 15 and the resistive combination 16 and 17 operates on $E(t)$ and $p(t)$ to produce the constant amplitude phase modulated component $S'_2(t)$ which contains the derived phase fluctuation $\phi(t)$.

Phase modulator 12 modulates $$K \sin [\omega t + \theta(t)] \quad (11)$$

which is $p(t)$ shifted 90° by phase shifter 13, by $V_o(t)$ the output from inverting amplifier 11. This produces $$S'_2(t) = K \sin [\omega t + \theta(t) + k_1 V_o(t)] \quad (12)$$

where $k_1$ is the modulation sensitivity of modulator 12. This signal $S'_2(t)$ is then multiplied by $p(t)$ in mixer 14 to produce $$p(t)\, S'_2(t) = K^2 \sin [\omega t + \theta(t) + k_1 V_o(t)] \cos [\omega t + \theta(t)] \quad (13)$$

which is filtered by lowpass filter 15 having unity gain.

The filter output $$V_1(t) = (K^2/2) \sin [k_1 V_o(t)] \quad (14)$$

has a positive slope as is required for dc stability of the overall feedback loop so long as $k_1 V_o(t)$ $\pi/2$ and amplifier 11 is an inverting amplifier.

The input impedance of amplifier 11 is made high compared to resistors 16 and 17 having resistances $R_1$ and $R_2$, respectively, so that it may be assumed that $$E(t) - V_i/R_2 = V_i - V_1(t)/R_1 \quad (15)$$

$$V_i = [E(t)R_1 + V_1(t)R_2]/(R_1+R_2) \quad (16)$$

Combining $V_o(t) = -AV_i$, where $A$ is the magnitude of the gain of amplifier 11, and Equations (14) and (16) yields $$V_0(t)\left[1 + A\frac{\frac{K^2}{2} R_2 \sin k_1 V_0(t)}{(R_1+R_2)V_0(t)}\right] = -A\frac{E(t)R_1}{R_1+R_2} \quad (17)$$

As previously indicated, dc stability requires that the $|k_1 V_o(t)| \leq \pi/2$, which from Equation (17) necessitates a restriction of the maximum amplitude of $E(t)$. Under this condition the smallest value of $\sin k_1 V_o(t)/V_o(t)$ is $2k_1/\pi$, and the largest value, which occurs when $V_o$ is small and $\sin k_1 V_o(t)$ is approximately equal to its angle $k_1 V_o(t)$, is $k_1$. Thus, if A $>>(R_1+R_2/K^2R_2)\,\pi/k_1$ Equation (17) becomes $$E(t) = -(K^2/2)(R_2/R_1) \sin k_1 V_o(t) \quad (18)$$

and the approximation of Equation (18) can be made as good as required by making A, the gain of amplifier 11, sufficiently large. The size of A will be dictated by the distortion limits placed on the overall LIND amplifier, but will be normally on the order of 1,000. $K$, $R_1$ and $R_2$ are chosen such that:

$$(K^2/2)(R_2/R_1) = E_m \quad (19)$$

so that from Equations (18) and (3):

$$k_1 V_o(t) = -\phi(t) \quad (20)$$

Therefore, from Equation (12) it is seen that the output $S'_2(t)$ from component separator 10 is one of the desired components:

$$S'_2(t) = K \sin [\omega t + \theta(t) - \phi(t)] \quad (21)$$

which is equal to $S_2(t)$ times a constant $2K/E_m$.

$S'_1(t)$ is produced by inverting $V_o(t)$ in inverter 18 and modulating it onto $K \sin [\omega t + \theta(t)]$ in phase modulator 19 so that $$S'_1(t) = K \sin [\omega t + \theta(t) + \phi(t)] \quad (22)$$

which is equal to $S_1(t)$ times the same constant $2K/E_m$.

The feedback loop must, of course, be designed to satisfy ac phase shift and gain conditions required for stability. It is noted that if phase modulators 12 and 19 do not produce an exactly linear phase change as a function of modulating voltage $V_o$ (i.e., if $k_1$ is a function of $V_o$), the high gain A in the feedback loop will compensate for this imperfection by distorting $V_o(t)$ so that Equation (20) is still satisfied. The only requirement is that the two phase modulators 12 and 19 have the same modulation characteristic $k_1(V_o)$. The matched modulator requirement can be removed by providing a second similar feedback loop with its own high gain amplifier, phase modulator, etc. for producing $S'_1(t)$ directly from $E(t)$ instead of indirectly from $V_o(t)$. The second loop could be identical to the one shown but driven by $-E(t)$ to produce the phase modulated output of $S'_1(t)$.

As indicated above components $S'_1(t)$ and $S'_2(t)$ satisfy the requirements of being constant amplitude phase modulated components which contain the total information content of input $S(t)$. These components may then be amplified by a common gain factor G' in identical amplifiers 28 and 29 which may or may not be linear in characteristic and as such may be any of many readily available devices such as injection locked GUNN diodes, IMPATT diodes, or other phase locked oscillators or nonlinear amplifiers. A linear recombination of the amplified components by combiner 30 in accordance with Equation (2) will yield $4KG'/E_m$ times $S(t)$ which is the desired linearly amplified replica of the input.

Figure 5:
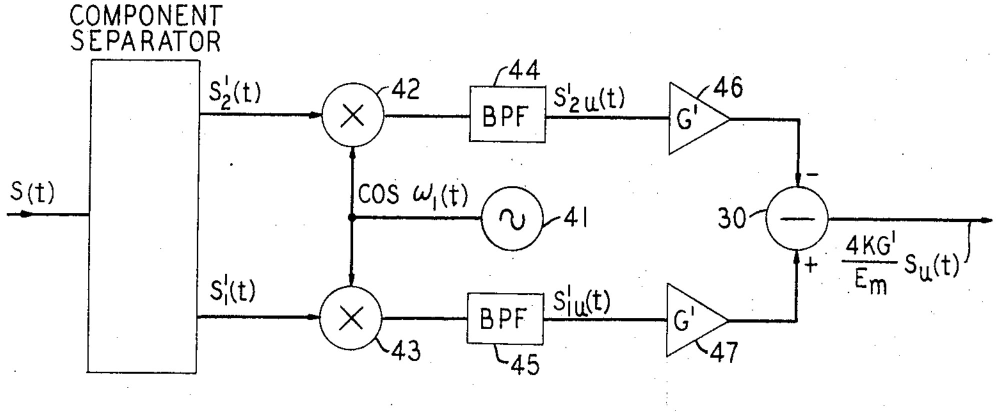
FIG. 5 is a block diagram of a LIND amplifier circuit capable of additionally providing frequency translation.

In many microwave or millimeter wave transmitter applications, a signal at a lower frequency in the 10's or 100's of MHz must be translated to a higher frequency and amplified linearly to a high power level. While it is not possible to do this with the current state of the art devices for use in the upper microwave or millimeter wave frequencies, this operation can be performed easily, using the component separation technique of a LIND amplifier as shown in FIG. 5. The low frequency signal input $S(t)$ is separated to produce an $S'_1(t)$ and $S'_2(t)$ which are then translated in frequency using common oscillator 41 and a pair of mixers 42 and 43. Oscillator 41 generates a sinusoidal signal at $\omega_1$, and the translated outputs are bandpass filtered by filters 44 and 45 to produce the upper sideband outputs:

$$S'_{2u}(t) = (2K/E_m) \cos [\omega + \omega_1) t + \theta(t) - \phi(t)] \quad (23)$$

and $$S'_{1u}(t) = (2K/E_m) \cos [(\omega + \omega_1) t + \theta(t) + \phi(t)] \quad (24)$$

respectively. The mixers and subsequent amplifiers 46 and 47 can, of course, be nonlinear, and recombination in combiner 30 yields a linearly amplified replica of input signal translated to frequency $\omega + \omega_1$. It is noted that amplifiers 46 and 47 may be omitted in specific applications.

Frequency translation within a LIND amplifier will find considerable application in point-to-point and satellite microwave and millimeter wave repeaters. It may also be useful in amplifying frequency multiplexed combinations of many low level FM modulated channels, such as may be used in future high capacity mobile radio base stations.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. A circuit for linearly amplifying a bandpass input signal having amplitude variations comprising, separating means for forming from its input a pair of constant amplitude phase modulated components, the separating means being adapted to receive the bandpass input signal as its input, said separating means including first and second converting means for converting the amplitude variations of the bandpass input signal to phase modulation of the pair of components, the first converting means producing one of said pair of components, the one component being phase modulated in a first sense, the phase modulation of the one component being proportional to the arc sine of the amplitude variations of the bandpass input signal, the second converting means producing a second of the pair of components, the second component being phase modulated in a second sense opposite to the first sense, the phase modulation of the second component being proportional to the arc sine of the amplitude variations of the bandpass input signal, device means for independently amplifying each of the constant amplitude components by the same gain factor to produce processed components, and recombining means for linearly combining the processed components to reconstruct a restructured replica of the bandpass input signal, the phase modulation of the two components being converted to amplitude variations in the replica.

2. A circuit as claimed in claim 1 wherein said device means is a pair of amplifying devices having identical nonlinear gain characteristics.

3. A circuit as claimed in claim 1 wherein said circuit further includes means for independently translating the frequency of each of the constant amplitude components by an identical frequency shift.

4. A circuit as claimed in claim 1 wherein the one component produced by the first converting means is $C \sin [\omega t + \theta(t) + \phi(t)]$, and the second component produced by the second converting means is $C \sin [\omega t + \theta(t) - \phi(t)]$ where $C$ is a constant, $t$ is time, $\omega$ is the carrier frequency, $\theta(t)$ is the time-varying phase of the band-pass input signal, and $\phi(t)$ is the time-varying phase modulation defined by $E(t) = E_m \sin \phi(t)$ $E(t)$ being the time-varying amplitude of the bandpass input signal and $E_m$ being the maximum amplitude of the bandpass input signal.

5. A circuit for linearly processing a band-pass signal having amplitude variations comprising:

detecting means for providing a signal representative of the amplitude envelope of its input, limiting means for producing an amplitude limited version of its input, means for applying the bandpass signal as inputs for both the detecting means and the limiting means, a series circuit of a first phase modulator, a mixer, a lowpass filter, and a high gain amplifier connected in that order, the output of the limiting means being connected to the mixer where it is combined with the output of the first phase modulator, the output of the detecting means being connected to the input of the high gain amplifier, means for phase shifting the output of the limiting means, the phase shifted output of the limiting means being applied to the first phase modulator, the output of the high gain amplifier being applied to the first phase modulator where it modulates the phase shifted output of the limiting means to produce a first constant amplitude phase modulated component, whose phase modulation is proportional to the arc sine of the amplitude variations of the bandpass signal and varies in a first sense relative to the amplitude variations of the bandpass signal, a second phase modulator, the phase shifted output of the limiting means being applied to the second phase modulator, means for applying the output of the high gain amplifier to the second phase modulator where it modulates the phase shifted output of the limiting means to produce a second constant amplitude phase modulated component, whose phase modulation is proportional to the arc sine of the amplitude variations of the bandpass signal and varies in a second sense, opposite to the first sense, relative to the amplitude variations of the bandpass signal, device means for operating independently upon each of the constant amplitude phase modulated components to produce processed components, and recombining means for linearly combining the processed components to reproduce a restructured replica of the bandpass signal, the phase modulation of the two components being converted to amplitude variations in the replica.

* * * * *

UNITED STATES PATENT OFFICE
CERTIFICATE OF CORRECTION

Patent No. 3,777,275 Dated December 4, 1973

Inventor(s) Donald C. Cox

It is certified that error appears in the above-identified patent and that said Letters Patent are hereby corrected as shown below:

In column 1, line 25, "substantially" should be omitted.

In column 1, line 34, "substnatially" should read --substantially--.

In column 3, line 60, "$k_1V_o(t) \quad \pi/2$" should read --$|k_1V_o(t)| \leq \pi/2$--.

In column 3, line 66 (Equation 15), "$E(t)-V_i/R_2 = V_i-V_1(t)/R_1$" should read --$[E(t)-V_i]/R_2 = [V_i-V_1(t)]/R_1$--.

In column 4, line 12, "of", first occurrence, should read --on--.

In column 4, lines 13 and 14, "sin $k_1V_o(t)-/V_o(t)$" should read --sin $k_1V_o(t)/V_o(t)$--.

In column 4, lines 16 and 17 "$A>>(R_1+R_2/K^2R_2)\ \pi/k_1$" should read --$A >> [(R_1+R_2)/K^2R_2]\ \pi/k_1$--.

In column 5, line 22, (Equation 23), "$\cos[\omega + \omega_1)\ t + \theta(t) - \phi(t)]$" should read --$\cos\ [(\omega + \omega_1)\ t + \theta(t) - \phi(t)]$--.

Signed and sealed this 16th day of April 1974.

(SEAL)
Attest:

EDWARD M.FLETCHER,JR.
Attesting Officer

C. MARSHALL DANN
Commissioner of Patents